Sept. 14, 1965 A. E. MARTENS 3,206,697

MODIFIED WIEN-BRIDGE RC OSCILLATOR

Filed Sept. 8, 1961 2 Sheets-Sheet 1

INVENTOR.
ALEXANDER E. MARTENS
BY Frank E. Parker
Arthur L. Nelson
ATTORNEYS

INVENTOR.
ALEXANDER E. MARTENS
BY Frank C. Parker
Arthur L. Nelson
ATTORNEYS

United States Patent Office 3,206,697
Patented Sept. 14, 1965

3,206,697
MODIFIED WIEN-BRIDGE RC OSCILLATOR

Alexander E. Martens, Greece, N.Y., assignor to Bausch & Lomb Incorporated, Rochester, N.Y., a corporation of New York Filed Sept. 8, 1961, Ser. No. 136,791
3 Claims. (Cl. 331—141)

The invention relates to an audio oscillator and more particularly to a Wien-bridge oscillator having improved frequency response.

When a Wien-bridge RC oscillator is used for generation of signals of various frequencies, the values of the time constants in the RC group are usually varied simultaneously by varying the values of the two resistive components. Unfortunately, however, the conventional two stage amplifier used with this type of oscillator must be compensated to avoid phase shift during varying the frequency of oscillation. The compensation is to overcome the effects of capacitance throughout the circuit and thereby provide a more linear frequency response.

Accordingly this invention is intended to provide a more linear frequency response by introducing compensating capacitance in the negative feedback loop of the RC Wien bridge.

It is an object of this invention to provide a linear frequency response in an RC Wien bridge oscillator.

It is another object of this invention to introduce capacitance in the negative feedback loop to compensate for coupling capacitance, bypass capacitance, stray and input capacitance in the oscillator circuit.

It is a further object of this invention to introduce capacitance in the resistance legs of a Wien bridge circuit to compensate for the capacitance causing a phase shift over the frequency band and thereby providing a more linear frequency response throughout the range of oscillation.

The objects of this invention are accomplished by introducing capacitance in the negative feedback loop of the Wien bridge. The negative feedback loop is connected to the cathode of the first stage of the two stage amplifier. The positive feedback loop is connected to the grid of the first stage of the amplifier to provide a positive feedback to the first stage of amplification. The compensating capacitance in the negative feedback loop provides a more linear response of frequency of oscillation throughout the range of the oscillator.

The following illustrations and description sets forth the preferred embodiment of this invention. Any modification of a preferred embodiment within the principles as illustrated and described in the following paragraphs are considered to be within the scope of the invention.

When a Wien bridge RC oscillator is used for generation of signals with various discrete frequencies or for generation of signals having continuously variable frequency, the values of the two time-constants in the bridge are usually changed simultaneously by varying the values of the two resistive elements either continuously or in steps.

For the purpose of precise alignment of the oscillator it is customary to provide for a small adjustment of the two capacitors in the bridge by means of trimmer capacitors. This adjustment will shift the total frequency band, $\omega$, toward lower or higher end inversely proportional to the amount of capacitive adjustment according to the formula:

$$\omega=\frac{1}{RC}$$

where $$\omega=2\pi f$$

Unfortunately the conventional two stage amplifier used with this type of oscillation, if not properly compensated, will introduce phase shift, which will vary with the oscillator frequency. It is uneconomical and difficult to build an amplifier which will have 360° phase shift throughout the whole frequency band, because the effects of coupling and bypass capacitors, stray and input capacitances have to be neutralized. In general when resistance values are calculated for a certain frequency band, it will be found in actual operation that, although the high end of the band will have correct frequency values, the low end will not be tracking properly. The frequency will be higher than calculated, due to the non-linear phase shift in the amplifier.

By adding the capacitor to the negative feedback loop it is possible to alter the frequency response of the system so that the tuning will be linear throughout the range, while retaining the inexpensive and reliable A.C. amplifier.

Figure 1:
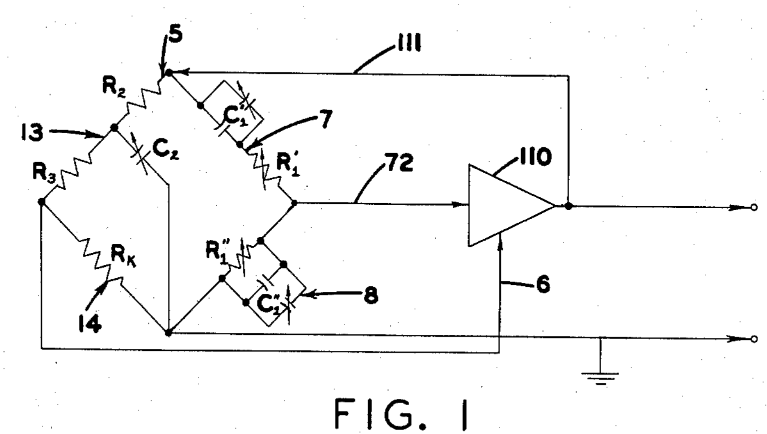
FIG. 1 is a schematic drawing illustrating the main components of the Wien bridge.

FIG. 1 is a schematic diagram illustrating the oscillator with the basic components in the bridge circuit. The amplifier 110 has its output connected to the bridge 5 through the conductor 111. The bridge circuit 5 provides a positive feedback to the grid of the amplifier through the conductor 72 and a negative feedback to the cathode of the first stage of the amplifier 110 through the conductor 6.

Making a reasonable assumption that within the desired frequency band the phase shift and thus the linearity deviation are small, the following expression can be derived for the oscillation frequency of the above oscillator circuit as illustrated in FIG. 1;

$$\omega=\frac{1}{C_1R_1}\sqrt{\frac{1}{1-\frac{C_2R_2[R_3+R_K(A-3)]}{C_1R_1[R_2+R_3+R_K(A+1)]}}}$$

where A equals the real part of the total open loop gain.

Since $R_2$ and $R_3$ are of the same order of magnitude as $R_K$ and A is greater than 3, this expression can be simplified to;

$$\omega=\frac{1}{C_1R_1}\sqrt{\frac{1}{1-\frac{C_2R_2(R_K+R_3)}{C_1R_1R_K}}}$$

If $R_3$ is made much smaller than $R_K$ the formula further reduces to $$\omega=\frac{1}{C_1R_1}\sqrt{\frac{1}{1-\frac{C_2R_2}{C_1R_1}}}$$

If we designate $$\omega_0=\frac{1}{C_1R_1}$$

which is the theoretical oscillation frequency of the conventional Wien-bridge oscillator, not containing a compensating network and having an amplifier linear with respect to the phase shift, our formula for oscillation frequency of the compensated Wien-bridge oscillator will take the following form:

$$\omega=\omega_0\sqrt{\frac{1}{1-\omega_0C_2R_2}}$$

It can be seen that the amount of correction depends on oscillation frequency, that the compensation will increase frequency of oscillation for any given value of $\omega_0$ and that the corrective action would tend to make the tracking linear, because compensation will be more effective at high frequencies.

The alignment will be accomplished in the following manner. Originally the low end is oscillating too fast due to previously stated reasons, which are unaffected by compensation, providing $C_1'$ and $C_1''$ have correct values. However, the high end is also fast due to the action of the compensating network. By increasing the capacitances of $C_1'$ and $C_1''$, the oscillator can be made to have linear tuning.

Figure 2:
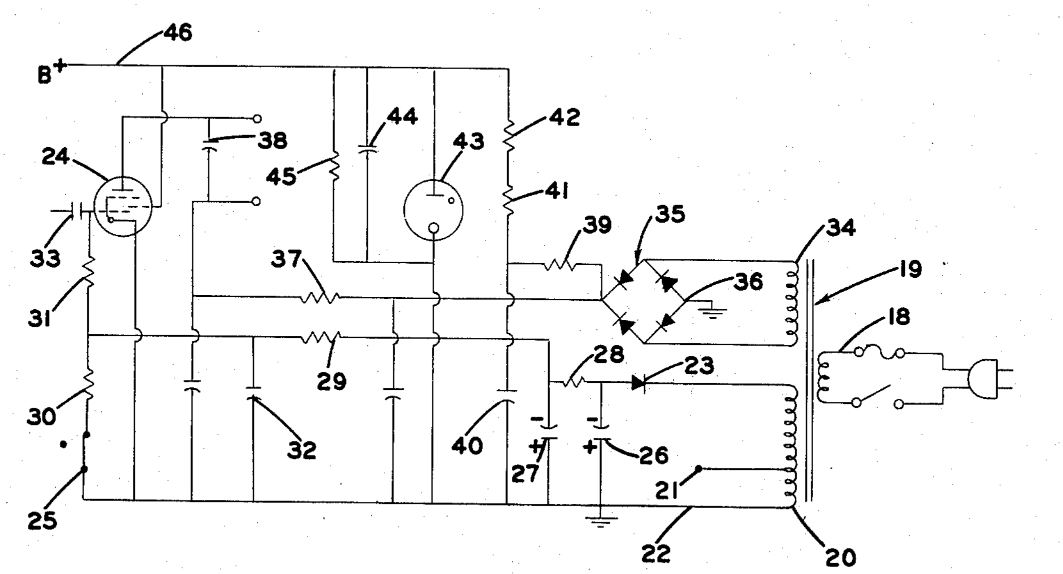
FIG. 2 is an electrical circuit of the power supply and amplifier tube adapted for use with an audiometer.
Figure 3:
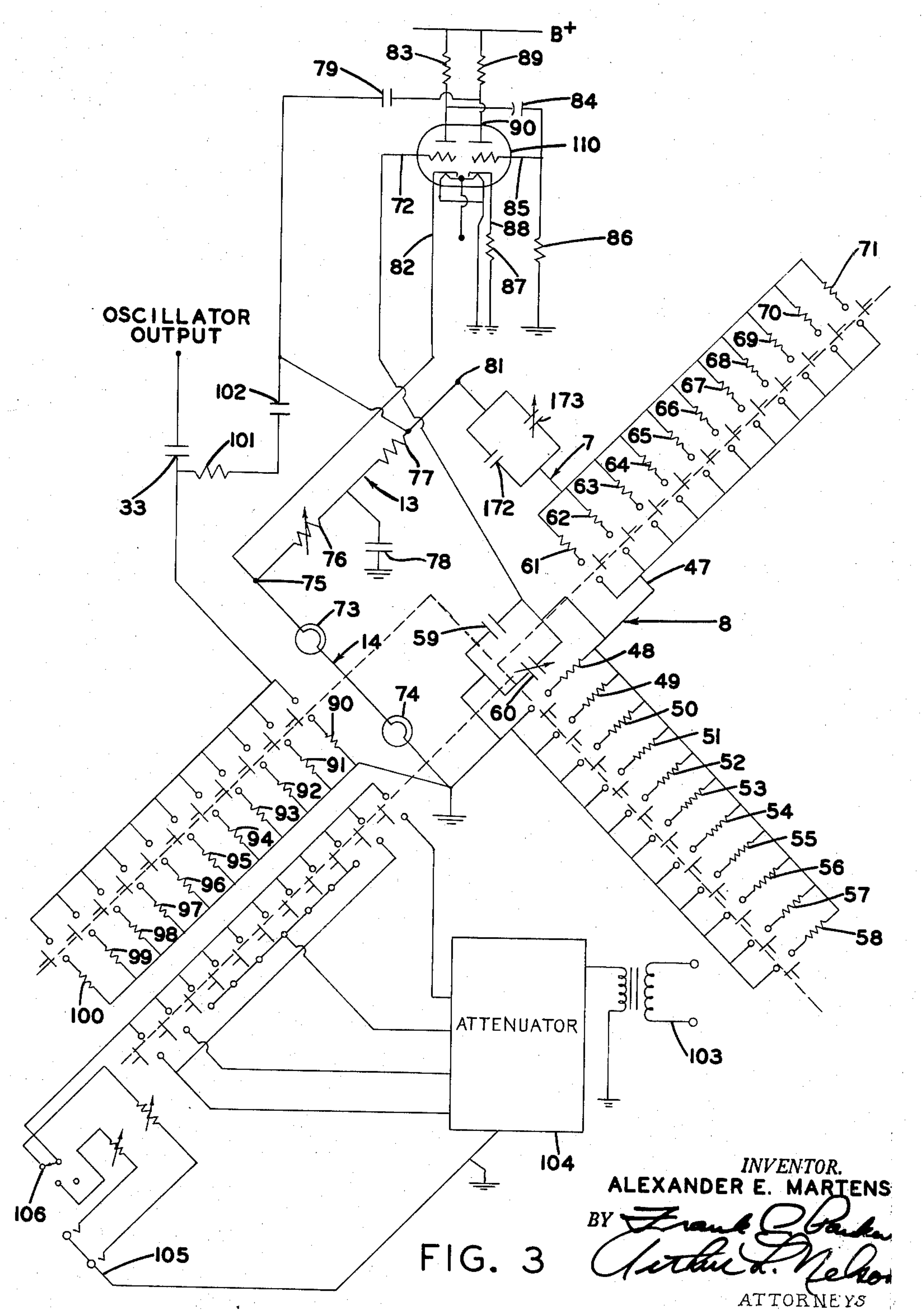
FIG. 3 illustrates the oscillator circuit and the output portion of the oscillator adapted for use in an audiometer.

FIGS. 2 and 3 illustrate a more detailed circuit adapted for operation with a two stage amplifier tube and an output amplifier stage. Referring to FIG. 2, the alternating current line 18 feeds into the primary winding of the transformer 19. The secondary winding 20 has a filament tap 21 and a ground connection 22. The opposite end of the secondary winding 20 is connected to a diode 23 for supplying a negative bias voltage for the amplifier tube 24. The bias voltage supplied is a high negative voltage of a sufficient value to cut off amplification of the tube 24 when the switch 25 is opened. The diode 23 operates through the filtering network of the capacitors 26 and 27 and resistor 28. A bleeder resistor 29 is connected in series with the resistor 28 and the grid resistor 30. A second grid resistor 31 is connected to the control grid of the tube 24. The capacitor 32 charges to a high negative potential when the switch 25 is opened, thereby cutting off the amplifier tube 24. The circuit illustrating the cutoff circuit for the amplifier tube 24 is covered under a related patent application. The capacitor 33 couples the amplifier stage tube 24 to the oscillator circuit. The oscillator circuit is illustrated in FIG. 3.

The secondary winding 34 feeds into a bridge rectifier circuit 35. The center tap 36 of the bridge rectifier 35 is connected to ground. The output of the rectifier 35 is connected to a resistor 37 which in turn is connected through the capacitor 38 to the plate of the tube 24. The capacitor 38 is for elimination of transients and frequency response compensation in the output circuit of the amplifier as it feeds into the output transformer for the attenuator.

The bridge rectifier is also connected through the resistor 39 to the capacitor 40 which is grounded. The resistors 41 and 42 are load resistors in the screen grid circuit of the amplifier tube 24. The gas tube 43 serves to stabilize the voltage output at approximately 150 volts on the screen grid for the amplifier tube 24. The capacitor 44 provides further filtering and, resistor 45 operates as a bleeder.

The power supply illustrated in FIG. 2 also provides B+ voltage for the oscillator tubes. The B+ present in the conductor 46 is connected to the plates of the two stage oscillator circuit illustrated in FIG. 3. The capacitor 33 couples the amplifier tube to the oscillator circuit which is also illustrated in FIG. 3.

FIG. 3 illustrates the oscillator circuit in a more detailed manner than FIG. 1. FIG. 3 illustrates the resistors and capacitors with means for switching the capacitive and resistive components in the circuit to provide a different frequency as well as controlling the amplitude of the oscillator output.

The leg 8 is connected to ground on one side and through an intermediate junction 47 is connected to the leg 7. The leg 8 includes the bank of resistors 48, 49, 50, 51, 52, 53, 54, 55, 56, 57 and 58. These resistors are connected in the circuit through a mating switch operating in series with the resistance. The leg 8 also includes a fixed capacitor 59 and a variable capacitor 60 which are also connected in parallel with one of the plurality of resistors which are connected to the circuit.

The leg 7 includes resistive and capacitive components in series. The resistive components 61, 62, 63, 64, 65, 66, 67, 68, 69, 70 and 71 are in series with the fixed capacitors 172 and the variable capacitor 173. The plurality of resistors 61 through 71 are connected in the circuit in a manner similar to the connection of the resistors 48 to 58. The mating switch for the corresponding resistor in each of the legs 7 and 8 are controlled by a gang switch. The gang switch operates in such a manner that a predetermined combination of resistors is controlled simultaneously and each of the legs has a predetermined resistor for the mating resistor in the leg 8. The values of the resistances vary to provide a variation in the resonant frequency of the feedback input signal to the control grid on the first stage of the oscillator tube 110. The grid 72 of the first stage is connected to the junction 47 intermediate of the legs 7 and 8.

The bridge circuit includes two resistance legs connected in series and in parallel with the resistance capacitance legs 7 and 8. The fixed resistance leg 14 is a nonlinear resistance comprising two tungsten lamp filaments 73 and 74 connected in series to ground. An intermediate junction 75 connects the leg 14 with the leg 13. The leg 13 comprises a variable resistor 76 and a fixed resistance 77 connected in series. An intermediate point connecting the resistors 76 and 77 is connected through the capacitor 78 to ground. Capacitor 78 provides a compensating means for linear response over the frequency range of the oscillator. The junction connecting the leg 13 with the RC leg 7 is coupled through the capacitor 79 to the plate 90 of the second stage of the oscillator tube 110. The feedback is transmitted through the coupling capacitor 79 to the junction 81 of the bridge circuit. The RC legs 7 and 8 apply a regenerative feedback through the control grid 72 of the first stage of the oscillator tube 110. A degenerative feedback is supplied to the cathode 82 of the first stage of the oscillator tube 110. The amplitude of negative feedback is controlled by the resistance legs 13 and 14. Junction 75 is connected to the cathode between the variable resistance leg 13 and the non-linear resistance leg 14. The feedback signal at the junction 75 is on phase with the regenerative feedback in the control grid 72. The non-linear resistance in the leg 14 also serves to maintain the amplitude of the signal in the first stage of the oscillator tube 110 because a tungsten element serves to increase its resistance as the current through the tungsten filaments increases. Both of these effects in the cathode serve to offset the regenerative effect of the signal on the control grid and thereby controls the amplitude of oscillator output.

The first stage of the oscillator tube 110 is connected to B+ through the load resistor 83. A coupling capacitor 84 couples the control grid 85 of the second stage of the oscillator tube 110. The voltage is impressed across the grid resistor 86 to apply a signal on the control grid 85 of the second stage of the oscillator tube 110. The cathode resistor 87 is connected between the cathode 88 and the ground of the second stage of the oscillator tube 110. A load resistor 89 connects the B+ supply voltage to the plate 90 of the second stage of the oscillator tube 110. The output of the second stage is fed back into the bridge network to provide regenerative and degenerative feedback in the control grid and cathode circuits respectively.

The output of the oscillator circuit is supplied by a resistive capacitive network connected in parallel with the resistance legs of the bridge network. The amplitude of the output at any particular frequency is controlled by the bank of resistors 90, 91, 92, 93, 94, 95, 96, 97, 98, 99 and 100. These resistors are connected to ground on one end and selectively and alternatively connected through an element of the gang switch which controls one of the plurality of resistors in the legs 7 and 8 as previously described. One of the resistors in the bank of resistors of 90 through 100, is connected in series with the resistor 101, through the capacitor 102 to the junction 81 which transmits the feedback from the second stage of the oscillator.

The capacitor 33 is the same capacitor as illustrated on the grid circuit of the amplifier tube 24. The signal is transmitted from the output of the bridge circuit of the oscillator through the amplifier and the output transformer 103. The output transformer feeds into an attenuator 104 which is used to select the proper volume output to the headphones.

The attenuator is connected through a fourth section of the gang switch which selectively connects a tap in the attenuator to provide the proper output to the earphone jack. The gang switch connects simultaneously a predetermined resistance in the bridge network as previously described. The output is then transmitted through to the jack 105 which connects to the left and the right earphones. The switch 106 selectively connects the earphone for the patient who is being tested.

The oscillator operates substantially in the following manner. The oscillator is a Wienbridge type of oscillator where the feedback is fed into an RC bridge network. A positive feedback is applied to the control grid of the first stage of the audio oscillator. A negative feedback is supplied to the cathode of the first stage of the audio-oscillator. The non-linear resistance element in the cathode of the first stage of the audio oscillator also has a degenerative effect and a stabilizing effect on the amplitude of the oscillator output.

As the first stage is conducting, current flows through the non-linear resistance which comprises the tungsten filament elements 73 and 74. The signal on the plate creates a voltage across the load resistor 83. This signal is transmitted through the coupling capacitor 84 to the control grid of the second stage of the oscillator tube 110. The signal is amplified in the second stage and causes a voltage across the load resistor 89 in the second stage of the oscillator tube 110. The feedback is transmitted through the coupling capacitor 79 to the junction 81 on the bridge network. The variable capacitor 173 in leg 7 together with the variable capacitor 60 in the leg 8 are to provide for a minor adjustment of the frequency of output. The plurality of resistors in each of the legs 7 and 8 are then selectively and alternatively connected in series in the leg to provide the particular output frequency desired. The resistance and capacitance in the legs 7 and 8 control the phase of the frequency on the terminal 47 which is connected to the control grid 72 of the input stage. The frequency desired arrives on the control grid 72 in phase, thus providing the condition necessary for oscillation of the circuit.

The two stages of the oscillator tube 110 have more than necessary amplification to support oscillation. The excess amplification is utilized in stabilizing the frequency and amplitude of oscillation. The stabilization of the amplitude and frequency of the osclator is accomplished through the degenerative feedback in the cathode 82 of the first stage of the oscillator tube 110. The feed-back as mentioned previously is applied on the junction 81 of the bridge circuit. The resistors 77 and 76 in the leg 13 and the tungsten filaments 73 and 74 apply signal voltage to the cathode which in phase with the signal applied to the grid 72. This phase relationship causes a degenerative effect on the first stage of amplification. The degenerative effect tends to stabilize the frequency of output and also tends to maintain the amplitude of the output. With an increase in current the resistance of the tungsten elements 73 and 74 increases. This effect has a degenerative effect on the amplification of the first stage in the oscillator circuit.

The output from the oscillator circuit is connected to an RC circuit connected across the bridge network. The bank of resistors connected to the gang switch provides a variable voltage on the resistor which is connected to the coupling capacitor 33 and the control grid for the amplifier tube 24. In this manner the amplitude of the oscillator output is also controlled by the value of the resistance connected by the gang switch.

The output of the amplifier operates through the attenuator which in turn controls the intensity of the output received in the earphones connected to the jack 105.

It is understood that the above described arrangement is illustrative and not restrictive in setting forth the invention covered herein. Other modifications may illustrate and describe this invention without departing from the spirit of the invention. All equivalent disclosures falling within the principle of the invention are considered to be a part thereof.

What is claimed is:

1. A Wien-bridge oscillator circuit comprising a first and a second stage amplifier each having a cathode, a grid, and a plate, a Wein-bridge having two resistive legs and two resistive-capacitive legs connected between a capacitive coupling to the plate of the second stage amplifier and ground, a junction intermediate the resistive-capacitive legs of said bridge connected to the grid of the first stage amplifier to provide positive feedback to said oscillator, a junction intermediate the resistive legs of said bridge connected to the cathode of the first stage amplifier to provide negative feedback to the oscillator, a variable resistance forming one of the resistive legs in said bridge, a positive temperature coefficient resistance forming the second resistance leg of said bridge, a capacitive means connected across a portion of said variable resistance and said positive temperature coefficient resistance to ground to provide capacitance in the negative feedback loop to thereby improve linearity of frequency response of the oscillator.

2. A Wien-bridge oscillator circuit comprising a first and a second stage amplifier each having a grid, a cathode, and a plate, a Wien-bridge having two resistive legs and two resistive-capacitive legs connected intermediate a capacitive coupling to the plate of the second stage amplifier and ground, means connecting the junction intermediate the resistive-capacitive legs of said bridge connected to the grid of said first stage amplifier, said resistive legs including a variable resistor and a fixed resistor forming the first resistive leg, a positive temperature coefficient resistance forming the second of said two resistive legs to provide stabilization of frequency, a capacitor connected intermediate said variable resistor and said fixed resistor in the first of said resistive legs to thereby improve linearity of frequency response of the oscillator frequency.

3. A Wien-bridge oscillator circuit comprising a first and a second stage amplifier each having a cathode, a grid, and a plate, a Wien-bridge including two resistive legs and two resistive-capacitive legs connected through a capacitor to the plate of the second stage amplifier and to ground, a plurality of resistors in each of said resistive-capacitive legs having switching means for selectively and alternatively connecting different resistors in said legs to vary the frequency of the oscillator, means connecting the junction of the resistive-capacitive legs to the grid of the first stage amplifier to provide positive feedback, said resistive legs includes a first leg consisting of a positive temperature coefficient resistance connected to the cathode of said first stage amplifier and to ground for stabilizing the frequency of the oscillator, a second resistive leg, capacitive means connected across a portion of said second resistive leg and said first leg to ground for reducing the frequency in the lower end of the frequency response to thereby improve the linear response of said oscillator throughout the oscillator band width.

References Cited by the Examiner

UNITED STATES PATENTS

| | | | |
|---|---|---|---|
| 2,346,396 | 4/44 | Rider | 331—141 |
| 2,602,139 | 7/52 | Hodder et al. | 331—140 |

ROY LAKE, *Primary Examiner.*